(12) United States Patent
Cox et al.

(10) Patent No.: US 6,663,440 B2
(45) Date of Patent: Dec. 16, 2003

(54) PRINTED CIRCUIT BOARD FOR PIN ARRAY CONNECTION

(75) Inventors: Allen Ronald Cox, Chandlers Ford (GB); Stephen Peter Legg, Warsash (GB); Neil Morris, Southsea (GB)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/194,170

(22) Filed: Jul. 12, 2002

(65) Prior Publication Data

US 2003/0013326 A1 Jan. 16, 2003

(30) Foreign Application Priority Data

Jul. 14, 2001 (GB) .............................. 0117227

(51) Int. Cl.[7] .............................................. H01R 13/24
(52) U.S. Cl. .......................... 439/700; 439/74; 439/824
(58) Field of Search ................................. 439/700, 824, 439/74, 289, 924.1, 55, 60, 65, 70, 67, 64

(56) References Cited

U.S. PATENT DOCUMENTS

| 5,447,442 | A |   | 9/1995  | Swart |                |
|-----------|---|---|---------|-------|----------------|
| 5,967,856 | A | * | 10/1999 | Meller | ........... 439/700 |
| 6,036,504 | A | * | 3/2000  | McHugh et al. | ...... 439/74 |
| 6,340,320 | B1 | * | 1/2002  | Ogawa | ........... 439/824 |
| 6,394,816 | B1 | * | 5/2002  | Watanabe | ....... 439/67 |

* cited by examiner

*Primary Examiner*—Renee Luebke
*Assistant Examiner*—Felix O. Figueroa
(74) *Attorney, Agent, or Firm*—Randall J. Bluestone; Harrington & Smith, LLP

(57) ABSTRACT

This invention relates to apparatus and a method for connecting a pin array and a circuit board. In particular, the invention relates to pin array connections used in connecting disk drives into disk drive enclosures. Connection is accomplished by using a multi-pinned plug connector which sequentially engages conductive surfaces at different levels within the receiving PCB. The plug connector is connected electrically at its opposing end to a second PCB.

15 Claims, 4 Drawing Sheets

PRINTED CIRCUIT BOARD FOR PIN ARRAY CONNECTION

FIELD OF THE INVENTION

This invention relates to apparatus and a method for connecting a pin array and a circuit board. In particular the invention relates to pin array connections used in connecting disk drive pin array connectors into disk drive circuit board enclosures.

BACKGROUND OF THE INVENTION

Disk drive pin array connectors are characterized in that they need to be plugged into and out of the enclosure without necessarily having power to the enclosure or power to the drive turned off. For instance, the drive may be one of many drives and it would be undesirable to power them all down just to remove one drive. In this respect it is desirable that the drives are hot pluggable and electrical damage caused by such action is minimized.

One method of preventing electrical damage to the disk or enclosure when removing or inserting the disk is to have some of the connections break or make before others, for instance having the live connections break before the ground connection when removing the plug or having it make after the ground connection when inserting the connection. This can be achieved by arranging the gap between the live connection points so that it is greater than the other connection points.

For instance, mobile phones have wire connection contacts for connecting the phone into a car hands-free phone mount with a power supply. The wire connection contacts in the phone are mounted on a carrier and one wire connection contact is raised higher than the others. The corresponding contacts in the phone mount are leaf spring contacts. When the phone is inserted into the phone mount the raised contact makes first connection upon insertion and breaks last connection upon release. The provision of a carrier with a raised contact allows sequential making and breaking of contacts. The wire connection contact carrier is a single component which is soldered to the circuit board along with the other components. This wire connection carrier only has one level of raised contacts. Furthermore the contacts in the carrier are arranged in a single line of a plurality (e.g., seven) of contacts, each about 4 mm long and just over 1 mm apart.

Another design uses surface mount connectors but surface mount connectors do not perform very well under sideways forces as the solder joints can fail within the solder or lift the copper lands on the board.

In a disk drive a connector typically has more than twenty contacts for connection with the enclosure and requires a positive and firm connection.

U.S. Pat. No. 5,447,442 discloses a connector pin array which may be used for multiple firm connections. Each of the pins is individually sprung so that it is independently movable and makes a firm electrical connection with its contact point. The socket housing comprises passageways for receiving the pins and making a connection.

The prior art comprises components for making a firm connection which allows for sequential making and breaking of the contacts but there is room for improvement in the areas of simplicity, cost, flexibility of design and reliability of connection.

OBJECTS AND SUMMARY OF THE INVENTION

It is a primary object of the invention to enhance the art of arrayed pin connections.

It is another object of the invention to provide an enhanced connection of this type between a pin array and a printed circuit board.

An even further object is to provide such an improved connection for use in connecting disk drives and the like.

According to one aspect of the invention, there is provided a plug connector for electrically connecting a first PCB to a second PCB having at least two different conductive layers therein at different levels, the plug connector electrically connected to the first PCB and comprising a plug housing adapted for being positioned on the second PCB, a pin carrier movably positioned within the plug housing while the plug housing is positioned on the second PCB, at least two pin mechanisms positioned within the pin carrier, each including a conductive pin movably positioned within the pin carrier and extending therefrom, a first of the conductive pins engaging a corresponding one of the conductive layers in the second PCB, and the second conductive pin engaging another of the conductive layers in the second PCB after the first pin engagement with the first conductive layer in response to the movement of the pin carrier within the plug housing.

According to another aspect of the invention, there is provided a method of electrically connecting a first PCB to a second PCB having at least two different conductive layers therein at different levels within the second PCB, the method comprising electrically coupling a plug connector at one end thereof to the first PCB, positioning a plug housing of the plug connector on the second board, the plug connector further including a pin carrier and at least two pin mechanisms positioned within the pin carrier and including a pin as part thereof, moving the pin carrier within the plug housing to cause a first of the pins of one of the pin mechanisms to engage a first conductive layer within the second PCB, and thereafter further moving the pin carrier within the plug housing to cause a second of the pins of the other of the pin mechanisms to engage a second conductive layer at a different level within the second PCB after the first pin has engaged the first conductive layer.

By replacing the standard connector plugging system with variable depth contacts manufactured directly on the circuit board the cost of connecting disk drives to the enclosure is reduced. At the same time the robustness of the interconnection between removable disk files and multiple stacking systems is maintained. The thickness variation is utilized to maintain the plugging sequence to allow hot plugging of the devices.

The preferred embodiment of invention reduces the manufacturing tolerances of the mating parts and also eliminates any sideways stresses induced into the connection due to misalignment. Conventional connectors typically require precise alignment of the two matting halves, whereas this invention allows for greater tolerances of connector to board displacement because the electrical connection is always equally good, irrespective of misalignment.

Contact positions on the back board can be optimized as these are not dictated by the connector design, which allows better card design and more efficient board layout so high-speed signals and ground returns can be routed for best electrical performance.

In summary, the preferred embodiment of the invention has the following advantages. It allows space for further product enhancements. It reduces costs in a very competitive section of the market. It removes detrimental sideways stresses in the standard connector system and applies the force in the direction of the contact. It removes a card assembly process of the high density connector required for each docking position.

BRIEF DESCRIPTION OF THE DRAWINGS

A preferred embodiment of the invention will now be described in detail by way of example only with reference to the following drawings.

BEST MODE FOR CARRYING OUT THE INVENTION

Figure 1:
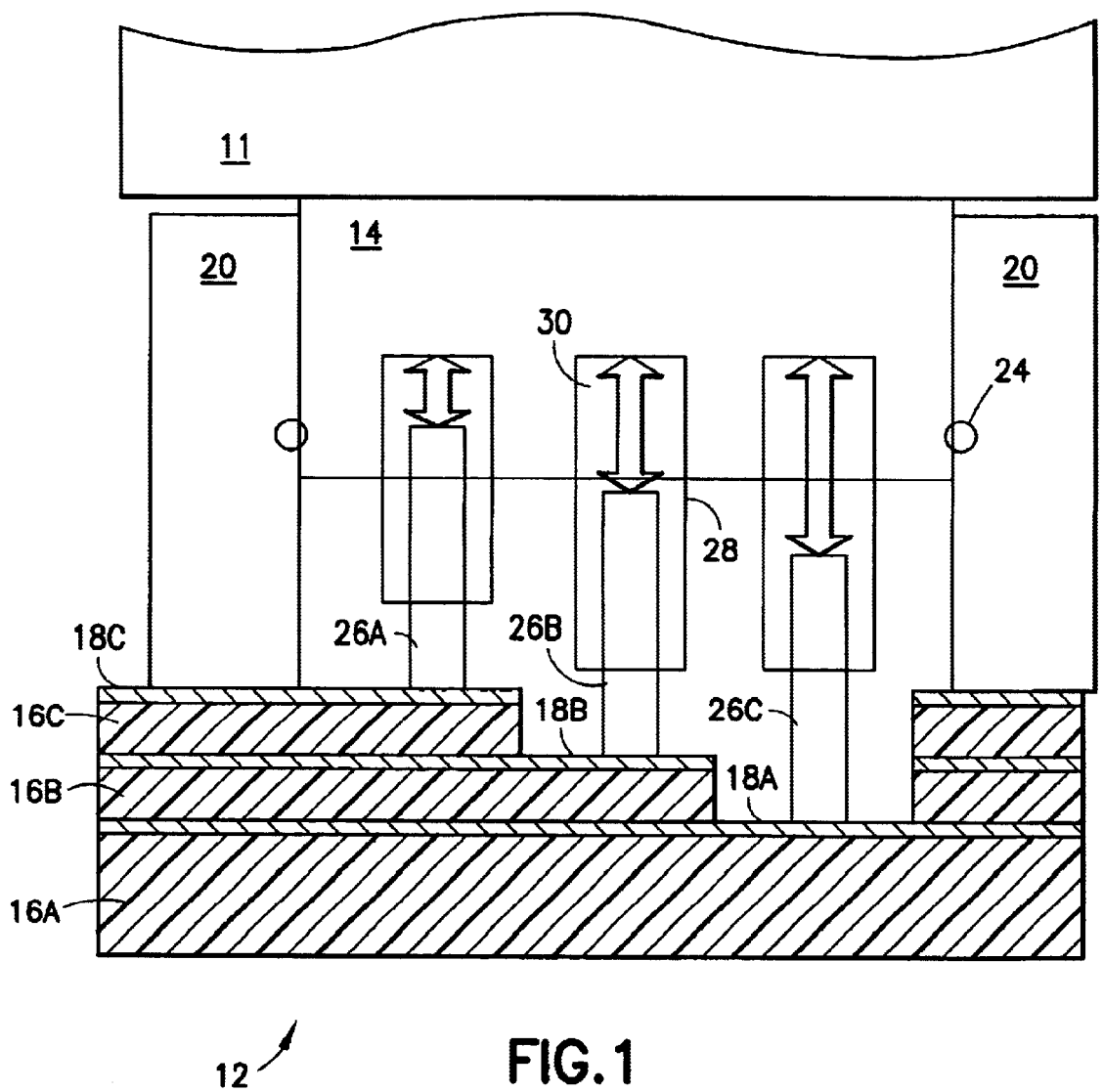
FIG. 1 shows a schematic of a pin array plug and a circuit board according to one aspect of the present invention.

FIG. 1 shows an edge of a storage subsystem printed circuit board (PCB) 11, a three pin array plug (pins 26A–26C) and a portion of a disk enclosure PCB 12 attached together and forming an electrical connection. The plug, comprised of a housing 20, pin carrier 14 and a plurality of pin mechanisms (each a barrel 28 with a movable pin, i.e., 26A, therein), includes preferably twenty pin mechanisms held in pin carrier 14 (only three, 26A–26C, are shown). The three pin mechanisms are an example of different depthed pin mechanisms from the twenty pin mechanisms. PCB 12 comprises three substrate layers 16A, 16B and 16C and above each substrate layer 16A, 16B, 16C is a respective conducting layer 18A, 18B, 18C. Mounted on the uppermost PCB layer 18C is the plug housing 20, fixed to the printed circuit board. Plug housing 20 and pin carrier 14 are removably attached at latch mechanism 24. As stated, each pin mechanism comprises one of the aforementioned pins 26A,B,C, each spring mounted inside a barrel 28 by a spring 30. Each pin can move between an extended position with maximum displacement from the barrel to a compressed position with minimum displacement from the barrel. The pins are conductive and form electrical connections with the storage subsystem circuit board through conductive paths (not shown) to conductors (not shown) on PCB 11. Such conductive paths and PCB conductors may be formed of many components known in the art and further description is not believed necessary. In FIG. 1, the pins are engaged with circuit board 12 and electrical paths are formed between the disk carrier module and the disk enclosure PCB. The storage subsystem PCB 11 holds a disk drive and control circuitry (not shown). Such components are known and further description not necessary.

Figure 2A:
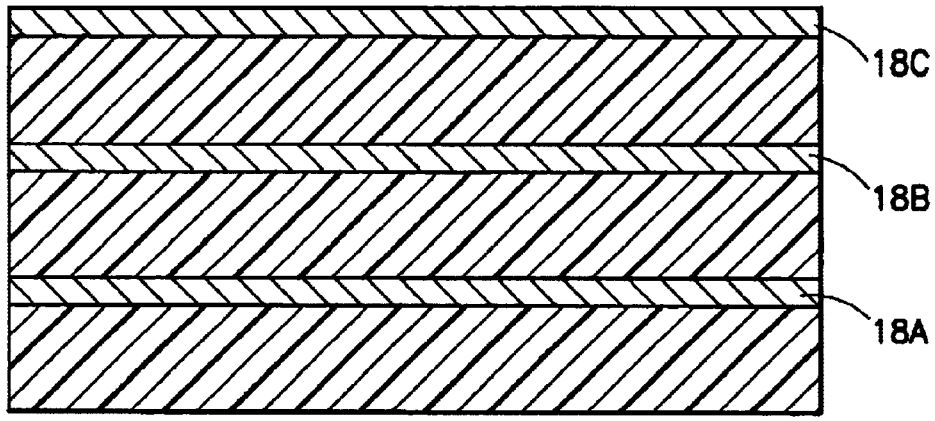
FIGS. 2A to 2C shows the stages of circuit board production according to one embodiment of the invention.
Figure 2B:
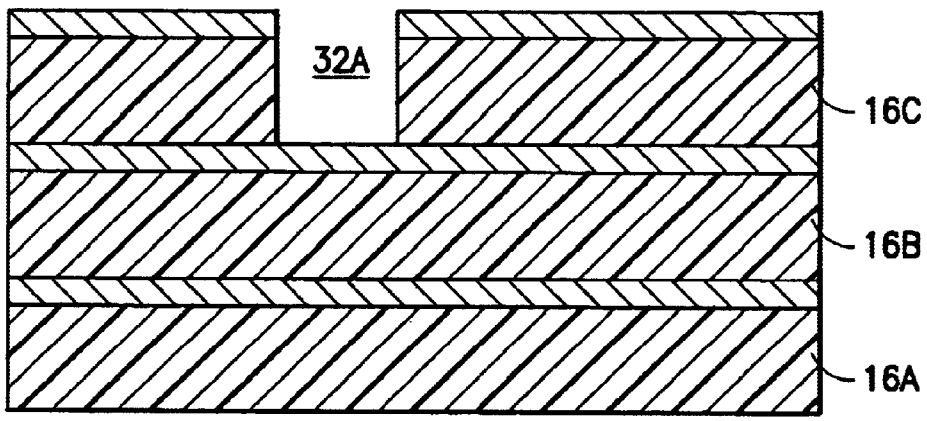
Figure 2C:
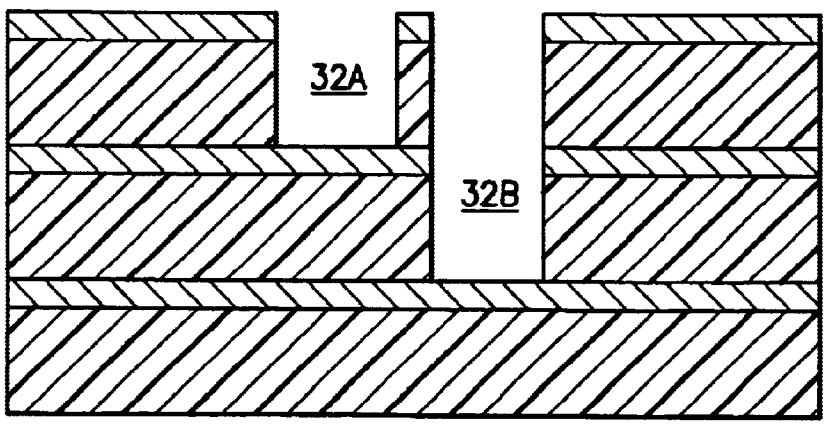

FIGS. 2A to 2C and 3A to 3B each show three stages of circuit board manufacture for different embodiments. In the first embodiment of FIG. 2A, the PCB is complete and no processing has been performed. Processing in the invention uses known PCB drilling procedures to create blind and buried vias as needed. The first processing step drills a section from conductive layer 18C and substrate 16C to produce a first via 32A as shown in FIG. 2B. The second processing step removes a section from conductive layer 18C, substrate 16C, layer 18B and substrate 16B to produce a second via 32B as shown in FIG. 2C. The exposed circuit board conductive layers 18A, B and C provide the contact points for the pin array plug shown in FIG. 1.

Figure 3A:
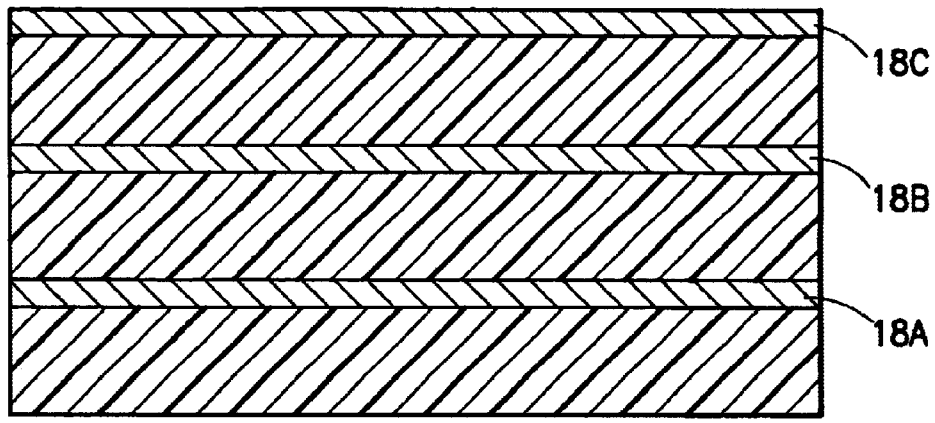
FIGS. 3A to 3C shows the stages of circuit board production according to another embodiment of the invention.
Figure 3B:
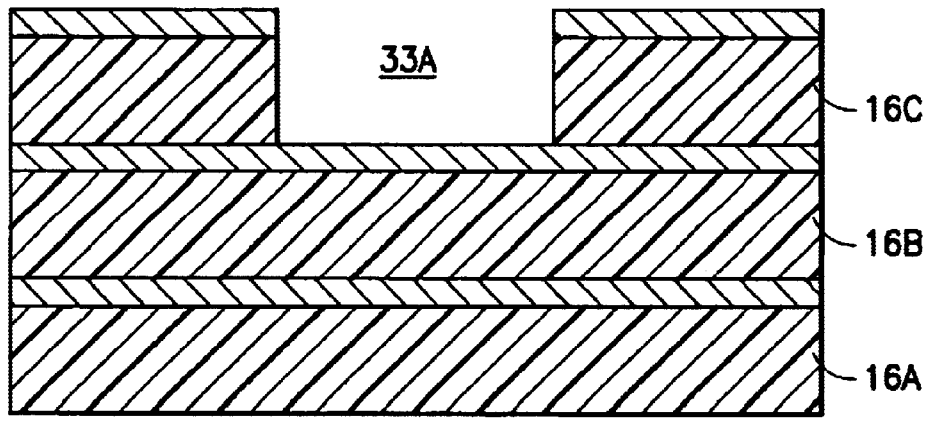
Figure 3C:
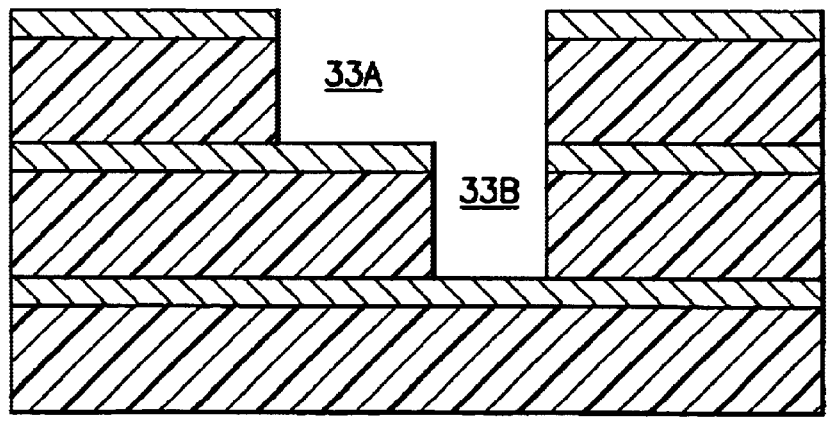

In the second embodiment of FIG. 3A, the PCB is complete and no sections have been removed. Processing of the PCB, like that in FIG. 2A, is accomplished using known PCB processes, e.g., lamination, etching, etc. The first processing step etches a section from conductive layer 18C and substrate 16C to produce a first via 33A as shown in FIG. 3B. Via 33A of the second embodiment is shown larger in size (width) than the corresponding via 32A in the first embodiment of FIG. 2A because of the etching process as it etches all desired vias 33A simultaneously. As stated, several may be formed. Individual etching of vias is, of course, also possible. The second processing step etches a section from conductive layer 18B and substrate 16B to produce a second via 33B as shown in FIG. 3C. The exposed circuit board of conductive layers 18A, B & C provides the contact points for the pin array plug of FIG. 1. Vias 33A and 33B are not separated by board material and thus share common space in this second embodiment, due to the etching process. This is opposed to the first embodiment where the vias 32A and 32B are separated by portions of circuit board. Such separately drilled vias give greater electrical isolation and greater accuracy of alignment for the contacts. As stated, separate vias can be formed by etching, using additional etching steps.

Figure 4A:
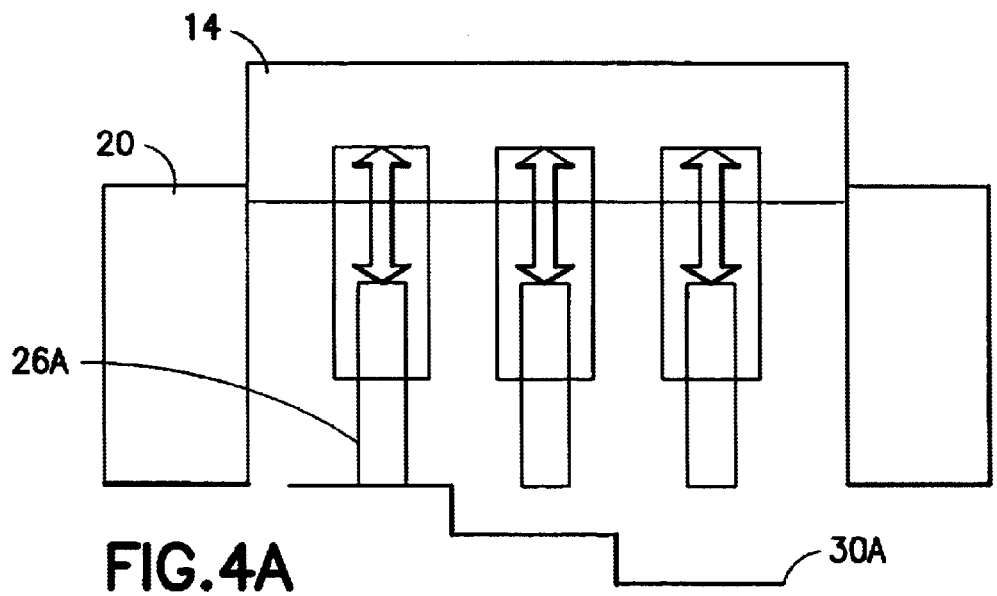
FIGS. 4A to 4C are schematic views showing the connection stages of the present invention.
Figure 4B:
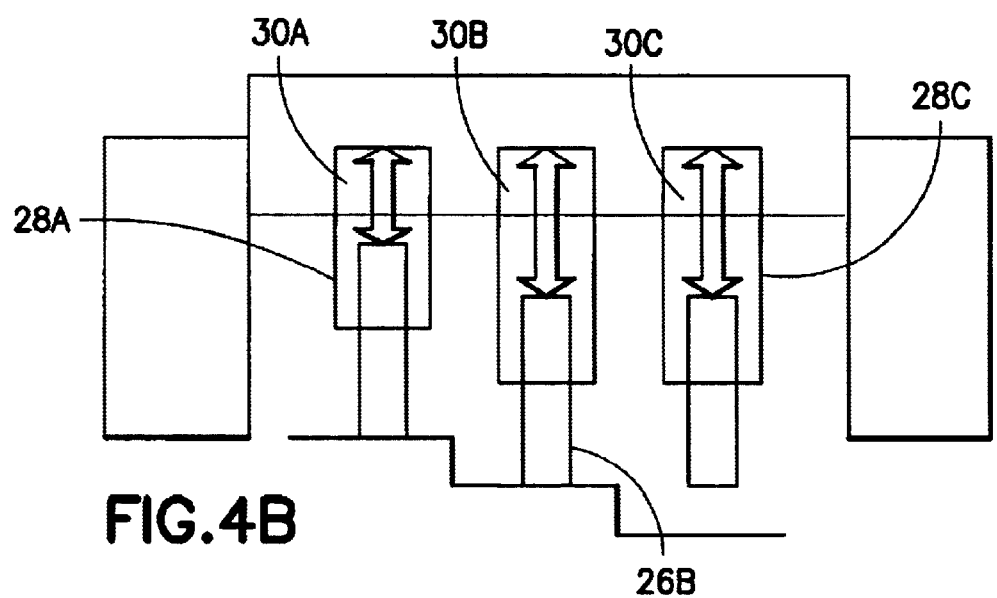
Figure 4C:
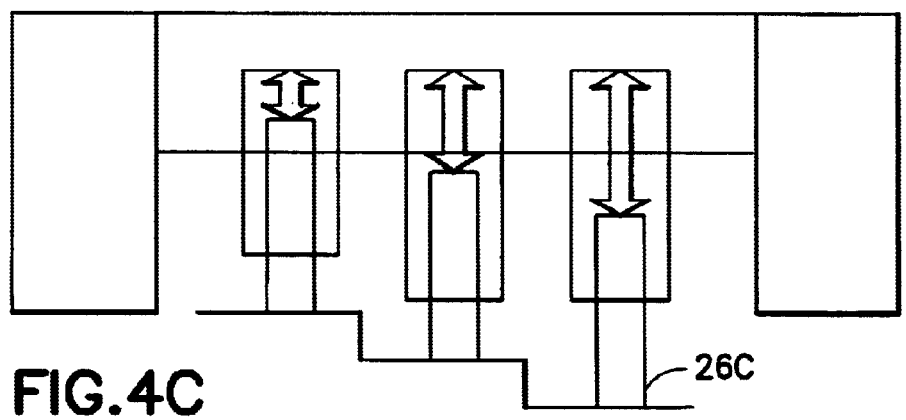

FIGS. 4A to 4C show the connection stages of the present embodiment in schematic view. In FIG. 4A the plug pin carrier 14 has been partially inserted into the plug housing 20 and pin 26A has made a first electrical contact with the top conductive layer 18C. All pins are fully extended at this stage, and neither of the two remaining pins have made contact.

Pin carrier 14 is further inserted into plug housing 20 such that pin 26B makes a second electrical contact with conductive layer 18B. The second electrical contact is made a discrete time interval after the first. Pin 26A is partially compressed against spring 30A in barrel 28A. Pins 26B and 26C are substantially extended.

Pin carrier 14 is now fully inserted into the plug housing in FIG. 4C and pin 26C makes a third electrical contact with conductive layer 18A. Plug housing 20 restrains carrier 14 in this position. Pin 26C is substantially extended. This third electrical contact is made a discrete time interval after the second. Pin 26A is compressed fully in barrel 28A. Pin 26B is partially compressed against spring 30B in barrel 28B.

Plug housing 20 in one embodiment is attached to PBC 12 by adhesive, but in other embodiments mechanical fixings could be used. In other embodiments, the array plug would have many more pin mechanisms, typically twenty or more for disk drive units. The embodiment shows a PCB with three different layers but in other embodiments two or more than three layers are possible. Furthermore, the configuration of the three layers could be different in other embodiments and it is not necessary for each pin to have a separate layer. Most pins could be on the same layer and only one pin could be at a different height. Moreover it is not necessary for each layer of substrate to have a corresponding conductive layer, but only a corresponding conductive contact. The conductive path could be formed from a different conductive layer in the PCB.

While there have been shown and described what are at present the preferred embodiments of the invention, it will be obvious to those skilled in the art that various changes and modifications may be made therein without departing from the scope of the invention as defined by the appended claims.

What is claimed is:

1. A plug connector for electrically connecting a first PCB to a second PCB having at least two different conductive layers therein of different levels within said second PCB, said plug connector electrically connected to said first PCB and comprising:

a plug housing adapted for being positioned on said second PCB;

a pin carrier movably positioned within said plug housing while said plug housing is positioned on said second PCB;

at least two pin mechanisms positioned within said pin carrier, each including a conductive pin movably positioned within said pin carrier and extending therefrom, a first of said conductive pins engaging a corresponding one of said conductive layers in said second PCB; and said second conductive pin engaging another of said conductive layers in said second PCB after said first pin engagement with said first conductive layer in response to further movement of said pin carrier within said plug housing.

2. The plug connector of claim 1 wherein each of said pin mechanisms further comprises a barrel, each of said conductive pins movably positioned within and extending from said barrel.

3. The plug connector of claim 3 further including a spring within each of said barrels operatively connected to said conductive pin to bias said pin outwardly from said barrel and to enable compression of said pin within said barrel.

4. The plug connector of claim 1 wherein said conductive pins are spring-loaded within said pin carrier.

5. The plug connector of claim 1 wherein the number of said pin mechanisms is three and the number of different level conductive layers within said second PCB is three.

6. A method of electrically connecting a first PCB to a second PCB having at least two different conductive layers therein at different levels within said second PCB, said method comprising:

electrically coupling a plug connector at one end thereof to said first PCB;

positioning a plug housing of said plug connector on said second PCB, said plug connector further including a pin carrier and at least two pin mechanisms positioned within said pin carrier and including a pin as part thereof;

moving said pin carrier within said plug housing to cause a first of said pins of one of said pin mechanisms to engage a first conductive layer within said second PCB; and thereafter further moving said pin carrier within said plug housing to cause a second of said pins of the other of said pin mechanisms to engage a second conductive layer at a different level within said second PCB after said first pin has engaged said first conductive layer.

7. The method of claim 6 wherein said second PCB includes first and second vias therein, a first of said vias exposing a first of said conductive layers within said second PCB and a second of said vias exposing a second of said conductive layers within said second PCB.

8. The method of claim 7 wherein said first and second vias are formed within said second PCB by drilling.

9. The method of claim 8 wherein said first and second vias are separated from one another by material of said second PCB.

10. The method of claim 7 wherein said first and second vias are formed within said second PCB by etching.

11. The method of claim 10 wherein said first and second vias are not separated by material of said second PCB.

12. A method for electrically connecting a first printed circuit board to a second printed circuit board, comprising:

providing a plug housing on one of said first printed circuit board and said second printed circuit board, said plug housing comprising at least two pin mechanisms each comprising a pin barrel that encloses a spring loaded moveable pin that is biased, in an uncompressed state, such that said pin extends outwardly from said enclosing pin barrel by a first amount and that is biased, in a compressed state, such that said pin extends outwardly from said enclosing pin barrel by a second amount that is less than the first amount;

providing a plug body upon a surface of the other one of said first printed circuit board and second printed circuit board, said plug body being adapted to receive said plug housing and enclosing a printed circuit board area wherein that are exposed electrical conductors that are disposed on at least two different layers of said printed circuit board;

inserting said plug housing into said plug body for contacting a first one of said spring loaded moveable pins to a first one of said electrical conductors that is disposed on a first layer of said printed circuit board; and further inserting said plug housing into said plug body for contacting a second one of said spring loaded moveable pins to a second one of said electrical conductors that is disposed on a second layer of said printed circuit board that is further removed from said surface than said first layer of said printed circuit board, thereby compressing said first one of said spring loaded moveable pins by a first amount and compressing said second one of said spring loaded moveable pins by a second amount that is less than said first amount.

13. A method as in claim 12, where said first printed circuit board comprises a storage subsystem printed circuit board and where said second printed circuit board comprises a disk enclosure printed circuit board.

14. A plug connector for electrically connecting a first printed circuit board to a second printed circuit board, comprising:

a plug housing for being disposed on one of said first printed circuit board and said second printed circuit board, said plug housing comprising at least two electrical connector means each comprising pin enclosure means for enclosing a moveable pin coupled to pin bias means, said pin bias means biasing said pin, in an unloaded state, such that said pin extends outwardly from said pin enclosure means by a first amount and further biasing said pin, in a loaded state, such that said pin extends outwardly from said pin enclosure means by a second amount that is less than the first amount; and a plug body for being disposed upon a surface of the other one of said first printed circuit board and second printed circuit board, said plug body being adapted to receive said plug housing and enclosing a printed circuit board area wherein that are exposed electrical conductor means that are disposed on at least two different layers of said printed circuit board;

said plug housing, when inserted into said plug body, contacting a first one of said pins to a first one of said electrical conductor means that is disposed on a first layer of said printed circuit board, and when further inserted into said plug body, contacting a second one of said pins to a second one of said electrical conductor means that is disposed on a second layer of said printed circuit board that is further removed from said surface than said first layer of said printed circuit board, thereby loading said first one of pins by a first amount and loading said second one of said pins by a second amount that is less than said first amount.

15. A plug connector as in claim 14, where said first printed circuit board comprises a storage subsystem printed circuit board and where said second printed circuit board comprises a disk enclosure printed circuit board.

* * * * *